United States Patent [19]

Kirchner et al.

[11] Patent Number: 4,860,066
[45] Date of Patent: Aug. 22, 1989

[54] SEMICONDUCTOR ELECTRO-OPTICAL CONVERSION

[75] Inventors: Peter D. Kirchner, Garrison; Ronald F. Marks, Ossining; George D. Pettit, Mahopac; Jerry M. Woodall, Bedford Hills; Steven L. Wright, Yorktown Heights, all of N.Y.

[73] Assignee: International Business Machines Corporation, Armonk, N.Y.

[21] Appl. No.: 1,472

[22] Filed: Jan. 8, 1987

[51] Int. Cl.[4] .................... H01L 29/267; H01L 31/00
[52] U.S. Cl. ......................................... 357/16; 357/30
[58] Field of Search .................. 357/30 K, 52, 54, 16; 437/132

[56] References Cited

U.S. PATENT DOCUMENTS

| | | | |
|---|---|---|---|
| 3,743,847 | 7/1973 | Boland | 357/30 K |
| 4,122,476 | 10/1978 | Hovel et al. | 357/16 |
| 4,235,651 | 11/1980 | Kamath et al. | 148/171 |
| 4,322,452 | 3/1982 | Krausse et al. | 427/82 |
| 4,354,198 | 10/1982 | Hodgson et al. | 357/16 |
| 4,396,793 | 8/1983 | Madan | 357/30 K |
| 4,427,841 | 1/1984 | Rahilly | 136/255 |
| 4,544,799 | 10/1985 | Barnett | 136/262 |
| 4,554,030 | 11/1985 | Haisma et al. | 437/105 |
| 4,634,474 | 1/1987 | Camlibel et al. | 437/132 |

FOREIGN PATENT DOCUMENTS 57-66677  4/1982  Japan .

OTHER PUBLICATIONS

1985 Electronic Materials Conference, Univ. of Colorado, Boulder, CO Jun. 19–21, 1985, "A p$^t$/p/n GaAlAs/GaAs/GaAs Graded Gap Solar Cell Structure with Improved UV Response" by Woodall et al.
IEEE Spectrum, Jun. 1985, p. 43 "Laser Diodes are Power-Packed" by Dan Botez.
Appl. Phys. Lett. 48 (10), 10 Mar. 1986, p. 641, "Si Film as an Annealing Cap for Si-Implanted GaAs" by Shim et al.
Conference Record, 17th IEEE Photovoltaic Specialists Conf., Kissimmee, Fla., May 1–4, 1984, pp. 106–110, "A High Quality Ar Coating for AlGaAs/GaAs Solar Cells" by Mitsui et al.
Applied Physics Letters, vol. 28, No. 3, Feb. 1, 1976, pp. 150–152, "High-Performance Solar Cell Material: n-AlAs/p-GaAs Prepared by Vapor Phase Epitaxy" by Johnston et al.
Semiconducting Diamonds in Electronics, B. M. Vul Solid State Devices 5th Conf., Tokyo 1973, p. 183.
"26% Efficient Magnesium-Doped AlGaAs/GaAs Solar Concentrator cells" by H. C. Hamaker et al. Appl. Phys. Lett. 47 (7), Oct. 1, 1985, p. 762.

Primary Examiner—William D. Larkins
Attorney, Agent, or Firm—Alvin J. Riddles; Thomas J. Kilgannon, Jr.

[57] ABSTRACT

An environmental interface for a semiconductor electro-optical conversion device layer that is optically transparent, electrically conductive and chemically passivating, made of an elemental semiconductor with an indirect band gap > 1 electron volt in a layer between 20 and 200 Angstroms thick. A GaAs covered by GaAlAs converter with a 100 Angstrom Si layer over the GaAlAs is illustrated.

8 Claims, 2 Drawing Sheets

SEMICONDUCTOR ELECTRO-OPTICAL CONVERSION

TECHNICAL FIELD

The technical field of the invention is in semiconductor electro-optical conversion. In semiconductor devices where electro-optical conversion takes place, either optical energy is converted to electrical signals or, alternatively, in response to an electrical signal, the device provides an optical energy output. Such devices are frequently useful under environmental conditions where a reaction between the environment and the material of the converter may occur. The environment in such applications as optical pyrometry for light to electrical conversion and lasers for electrical to light conversion can be quite stressful on the device. To minimize the effect of such reaction with the environment, protection is usually employed in the form of a transparent passivating covering over the portion of the device exposed to the environment.

BACKGROUND ART

One efficient semiconductor heterostructure electro-optical conversion device is a GaAs compound semiconductor having a pn junction therein and having a region of a graded band gap of GaAlAs on the surface thereof. Such a structure is shown in U.S. Pat. No. 4,122,476.

Greater efficiency in the GaAs-GaAlAs type structures was achieved where a graded band gap surface layer was provided consisting of AlGaAs which is graded from 0 to the vicinity of 80–100% aluminum over an approximately 200 nanometer depth from the surface. This provides a large band gap surface layer which enhances the short wavelength photoresponse. The surface layer is usually as heavily doped as possible to minimize an inactive region adjacent the surface that is depleted of carriers and in which there is no useful electro-optical conversion. Such structures are generally manufactured by the technique of molecular beam epitaxy using beryllium as a p-type dopant as described in a 1985 Electronic Materials Conference paper by J. M. Woodall entitled "A p+/p/n GaAlAs/GaAs/GaAs Graded Gap Solar Cell Structure with Improved UV Response".

In semiconductor injection laser technology, efforts have been directed to preventing the heat of the device from oxidizing the light emitting surface (IEEE Spectrum, June 1985, pages 43–53, "Laser diodes are power-packed" by Dan Botez).

As more potential applications for these devices are encountered, a tendency of the surface to react to the environment usually by oxidizing adversely affects performance. Heretofore, accommodations built into the structure for environmental reasons often conflict with other optical and electrical requirements.

DISCLOSURE OF THE INVENTION

Figure 1:
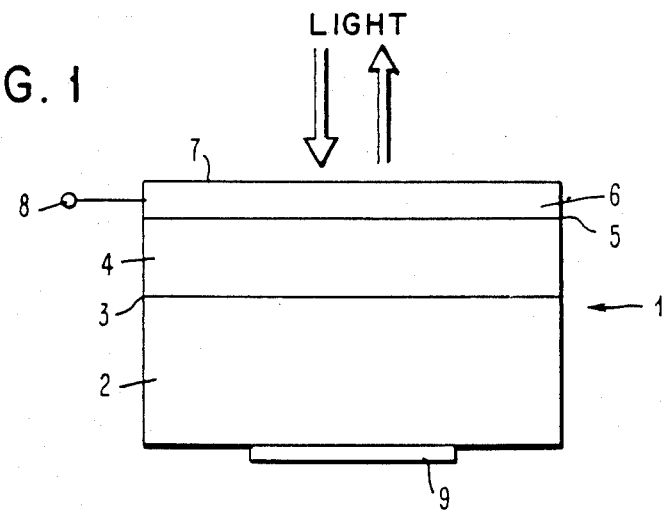
FIG. 1 is an illustration of the electro-optical conversion device of the invention.

The invention is an environment resistant interface for an electro-optical conversion device. A semiconductor electro-optical conversion structure is provided wherein materials for optimum electro-optical conversion are protected from deterioration by an environmental interface member that accommodates the chemical, optical and electrical constraints for the particular application. The environmental interface member under the conditions of use must be chemically passivating, electrically conductive and optically transparent.

It has been discovered that the conflicting chemical, electrical and optical requirements can be satisfied in an environmental interface member that is a continuous elemental semiconductor stable in air in a thickness range between 20 and 200 Angstroms with an indirect band gap above 1 electron volt.

In these devices, the electro-optical conversion portion is made up of materials that are selected for the optimum electro-optical conversion performance. In the path between the electro-optical conversion portion and the region outside the device where light is propagating, an environmental interface is provided of a material that is chemically passivating, electrically conducting and optically transparent.

In general, since metals tend to reflect, their properties, while advantageous for conductivity, are detrimental optically and environmentally. Similarly, metal oxides and other compounds in normal dimensions, while stable environmentally and suitable optically, are not electrically conductive and hence are not acceptable.

It has been found that an elemental semiconductor, although not normally considered to be transparent, can be provided with a combination of properties including a sufficiently thin physical dimension, doping and selection of band gap to produce an optimum environmental interface for a particular operating condition.

For most operating conditions, the elemental semiconductors Si, and the diamond allotropic form of carbon in a continuous layer between 20 and 200 Angstroms thick with an indirect band gap and an energy gap greater than 1 electron volt, satisfy the invention requirements. The material of the environmental interface must exhibit a chemical passivation type property that in the environmental conditions of use, it is completely inert or an optically and electrically acceptable stable continuous native coating is formed. A thin native oxide is usually acceptable if of the order of 50 Angstroms thick or less.

The material Si has the desirable property that a native oxide is formed that is impervious and very stable. Si further has an indirect band gap of 1.1 electron volts. The material diamond carbon has the desirable property of being completely inert. It has an indirect band gap of 4.0 electron volts.

The material of the environmental interface must exhibit an optical property of an optical absorption coefficient that is lower in the spectral region of application than that of the materials in the electro-optical conversion portion. If the fundamental band gap of the environmental interface material is indirect, then the band gap can be smaller than the fundamental band gap in the converter.

In accordance with the invention, this unusual combination of materials is effective due to the fact that the absorption coefficient increases much less steeply for photon energies above the fundamental gap of indirect band gap materials than for direct band gap materials, such as those that would be employed in the conversion region.

It has been found that when an elemental semiconductor, with an indirect band gap greater than 1 electron volt, is employed for the environmental interface material, the combination of dimensions and properties can be adjusted to provide the requisite electrical conductivity and yet retain the required chemical and optical properties.

While many variations in structure will be apparent to one skilled in the art in the light of the principles of the invention, for clarity in explanation, an example is chosen of a heterojunction semiconductor electro-optical converter responsive to shorter wavelength, principally blue light with 20 to 200 Angstroms thick elemental semiconductor environmental interface with an indirect band gap greater than 1 electron volt.

Such a converter has a semiconductor heterostructure electro-optical conversion portion of GaAs having a high mole fraction Al layer of GaAlAs between the GaAs-GaAlAs heterojunction and the source of light and between the electro-optical conversion portion and environment through which the source of light passes, the environmental interface of a layer of an elemental semiconductor of Si, or the diamond allotropic form of carbon which have a lower optical absorption coefficient for blue light than GaAs and GaAlAs and which is rendered transparent by limiting the thickness to the order of 100 Angstroms. The conductivity is adjusted by doping and the material is either inert or has an impervious thin native oxide.

The environmental interface layer may be applied by in situ deposition onto a Be doped high Al mole fraction AlGaAs epitaxial layer as grown on a GaAs substrate using the technique of Molecular Beam Epitaxy. It is important only that the surface of the GaAlAs be clean when the environmental interface layer of Si, or diamond carbon is applied.

The environmental interface benefit increases as the mole fraction of an ingredient that is environmentally sensitive increases. In the case of AlGaAs in an electro-optical converter, a sharp benefit is achieved as the mole fraction of Al becomes greater than 80%.

Referring to FIG. 1, an electro-optical converter with an environmental interface is illustrated.

In FIG. 1, there is an electro-optical conversion portion 1 selected for desirable electro-optical conversion properties. The portion 1 has a monocrystalline extrinsic conductivity, for example n type, GaAs substrate 2, with an interface 3 forming a pn junction with an opposite, for example p type, extrinsic conductivity epitaxial layer 4 of graded $Ga_{1-x}Al_xAs$ where x may vary between 0 and 1.

The light receiving surface 5 is covered with an environmental interface portion 6. The portion 6 has the chemical property that it provides a passivating capability, the optical property that it does not incompatibly attenuate the light and the electrical property of being conductive for signal development. Where the environment is of an oxidizing nature and the material in the interface portion 6 is Si, the Si passivates by forming an impervious native oxide layer on the surface 7. The optical absorption coefficient of the material of the portion 6 and any oxide or other environmental reaction coating formed thereon is lower than that of the material of the portion 4 for a particular light wavelength range involved in a particular application.

The portion 6 is deposited as a continuous thin film of the order of 20 to 200 Angstroms in thickness. The film must at least be an atomic monolayer. Since many useful materials are either not transparent or provide some light attenuation, the light transmission property usually determines the maximum thickness. This film may be epitaxial. The portion 6 is provided with an electrode 8 so that a signal can be developed between the electrode 8 and the ohmic contact 9 on the other side of the p-n junction at interface 3. The electrical conductivity of the portion 6 may be adjusted by doping. A doping level of the order of $10^{18}$ atoms/cc or higher is usually sufficient for most signal development purposes.

The thickness of the film in the portion 6 is about one tenth as thick as that of the anti-reflecting type coatings typically employed in optical devices in the art. In those anti-reflecting coatings, the thickness is usually ¼ wavelength which is of the order of thousands of Angstroms.

In operation, light entering or leaving the device through the environmental interface portion 6 passes essentially unattenuated through to electro-optical conversion portion. The material of the portion 6 is essentially optically transparent to the light frequencies suitable for the electro-optical conversion in the portion 1. The material further chemically serves as an impervious, non light attenuating coating that prevents deleterious environmentally produced reaction products from forming n the surface 5. Since the material of the portion 6 is electrically conductive, the signal has minimal electrical attenuation in portion 6 and is developed between conductors 8 and 9 proportional to the photon conversion in the region 1.

Figure 2:
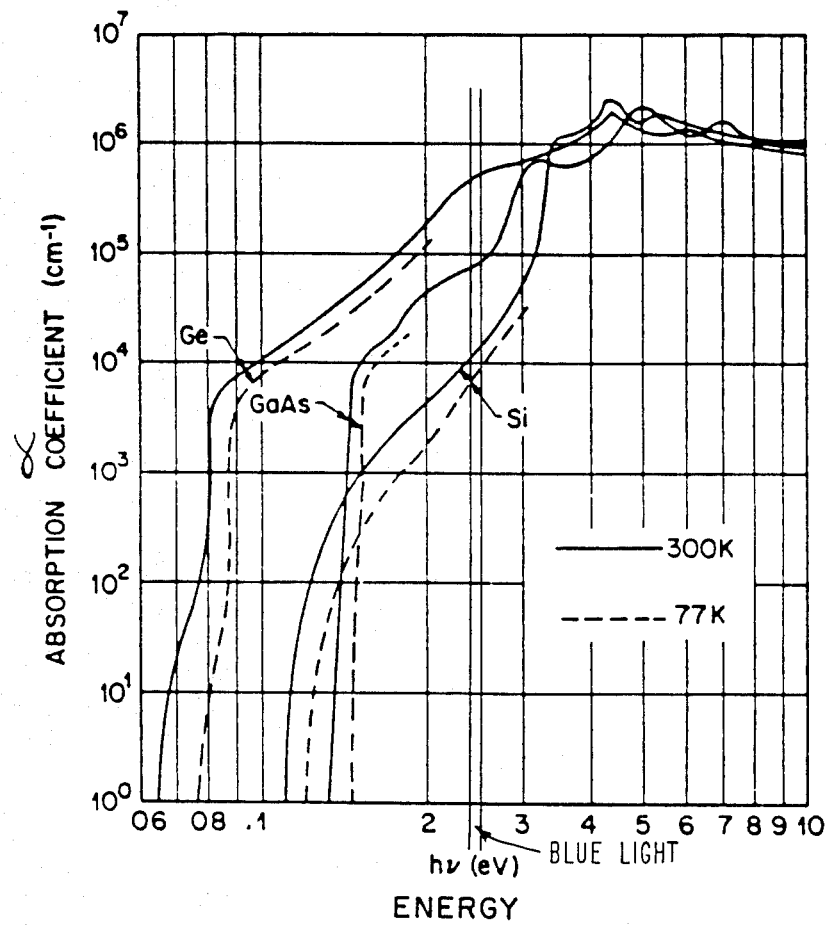
FIG. 2 is a graph showing the relationship between absorption and energy for different materials.

Referring next to FIG. 2, a graph is provided showing the relationship of absorption with energy to the band energy of semiconductor materials. A curve for an electro-optical converter and/or an environmental interface material are shown. The curve for Silicon (Si) with a band gap of 1.1 electron volts, illustrates an onset of absorption at lower energy that increases slowly and flattens whereas the absorption of Gallium Arsenide (GaAs) with a band gap of 1.4 electron volts begins at a higher level, increases sharply and then flattens so that one skilled in the art for the energy range of the particular application, blue light being the example, can readily identify the relative absorbencies in selecting the material for the environmental interface portion 6.

Figure 3:
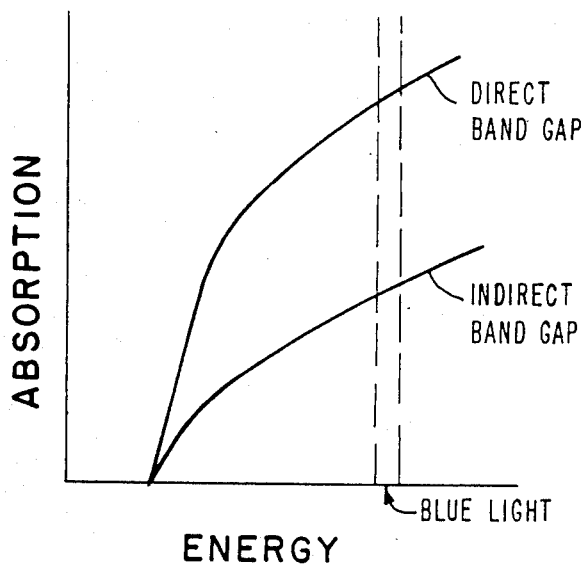
FIG. 3 is a graph showing the relationship between absorption and energy for materials with direct and indirect band gaps.

Referring next to FIG. 3, a graph is provided showing the relationship of absorption to wavelength. A curve for both direct and indirect band gap materials is shown. An indirect band gap material is preferable for the portion 6 due to the lower absorbency at the example blue light wavelength range.

Figure 4:
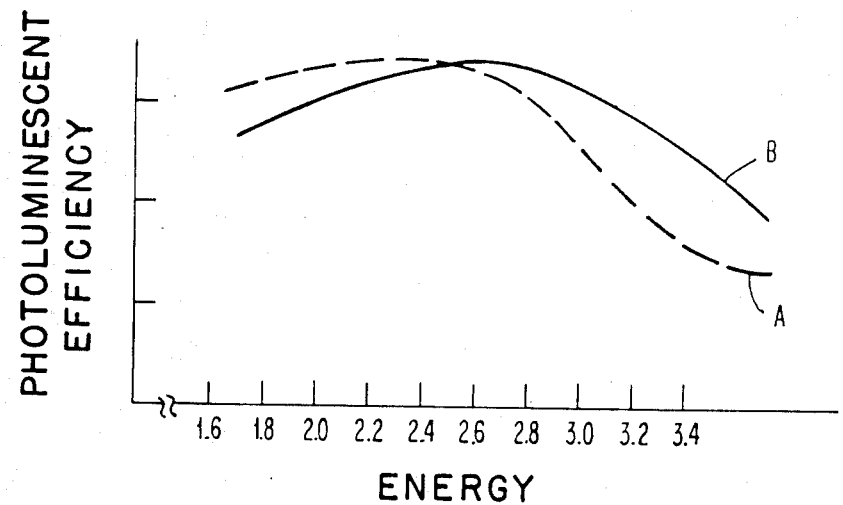
FIG. 4 is a graph showing the effect on photoluminescence efficiency of a direct band gap material.

The effect of a direct band gap material on absorbency is still further illustrated in FIG. 4 where in curve A, a GaAlAs-GaAs electro-optical converter with a 50 Angstrom coating of a direct band gap material GaAs on the surface the efficiency at higher energy is much lower than in curve B where the coating has been removed.

Best Mode For Carrying Out the Invention

The preferred embodiment is a $GaAs-Ga_{0.2}Al_{0.8}As$ electro-optic converter with a Si environmental interface as shown in FIG. 1.

The GaAs region 2 is grown by the standard technique in the art of molecular beam epitaxy (MBE) and is doped during growth with Si producing n type extrinsic conductivity. At the interface 3, aluminum is introduced into the growth environment and is progressively increased as the GaAlAs region 4 epitaxially progresses while at the same time the GaAlAs 4 is doped with Be, a suitable p-type extrinsic conductivity dopant, in a concentration of the order of $10^{17}$ to $10^{19}$ atoms/cc. While in the growth environment on the surface 5, a 100 Angstrom thick layer of silicon is deposited. The ohmic contacts 8 and 9 are made of Indium.

What has been described is an electro-optical conversion device having freedom of selection of materials for optimum electro-optical conversion with an environmental interface that provides chemical, optical and electrical properties that provide accommodation for use under environmentally stressful conditions.

Having thus described out invention, what we claim as new and desire to secure by Letters Patent is:

1. In a semiconductor electro-optical conversion device of the type wherein light is converted in a monocrystalline III–V compound semiconductor body to an electrical signal the improvement comprising a layer of epitaxial monocrystalline elemental semiconductor material having an indirect band gap greater than one electron volt covering at least a portion of the surface thereof and having a thickness in the range of 20–200 Å to render said layer transparent to light in the energy range of 2–3 eV.

2. The device of claim 3 wherein said elemental semiconductor is silicon.

3. The device of claim 1 wherein said semiconductor body includes a region of GaAs forming a semiconductor junction with a region of GaAlAs.

4. The device of claim 3 wherein the material in said layer of material covering at least a portion of the surface of said device is Si.

5. A semiconductor electro-optical converter comprising in combination
   a semiconductor body including a region of a monocrystalline III–V compound semiconductor material forming a heterojunction with another monocrystalline III–V compound semiconductor material having at least one light receiving surface,
   a layer of epitaxial monocrystalline elemental semiconductor material in contact with said light receiving surface of said semiconductor body, said layer having an indirect band gap greater than one electron volt and a thickness in the range of 20 to 200 Å to render said layer transparent to light in the energy range of 2–3 eV, and
   electrical contacts to said body and to said layer.

6. The device of claim 5 wherein said compound semiconductor is GaAs and said another compound semiconductor material is GaAlAs.

7. The device of claim 6 wherein said elemental semiconductor material is Si.

8. The device of claim 7 wherein said GaAlAs region is $p^+Ga_{0.1}Al_{0.9}As$; and the material of said layer is Si 100 Angstroms thick.

* * * * *